United States Patent [19]
Meyer

[11] Patent Number: 4,964,482
[45] Date of Patent: Oct. 23, 1990

[54] LOUDSPEAKER ENCLOSURE

[76] Inventor: John E. Meyer, 25 Deanewood Crescent, Don Mills, Ontario, Canada, M3B 1M6

[21] Appl. No.: 314,016

[22] Filed: Feb. 23, 1989

[51] Int. Cl.[5] ..................... H05K 5/00

[52] U.S. Cl. ..................... 181/146; 181/151; 181/153; 181/199

[58] Field of Search ............... 181/146, 148, 151, 153, 181/199, DIG. 1; 381/87–90

[56] References Cited

U.S. PATENT DOCUMENTS

| | | | |
|---|---|---|---|
| 2,878,887 | 3/1959 | Potter | 181/151 |
| 2,881,850 | 4/1959 | Bonn | 181/153 |
| 3,135,349 | 6/1964 | Lahti | 181/151 X |
| 3,430,728 | 3/1969 | Dunning | 181/151 X |
| 4,596,305 | 6/1986 | Jagborn | 181/151 |
| 4,802,551 | 2/1989 | Jacobsen | 181/146 |

*Primary Examiner*—Benjamin R. Fuller
*Attorney, Agent, or Firm*—Ridout & Maybee

[57] ABSTRACT

An enclosure for a loudspeaker is molded from a rigid acoustically inert material such as a polymer concrete. Preferably, the enclosure has an inner shell of a semi-rigid acoustically absorbent material providing damping for the enclosure. The enclosure may be conveniently manufactured by using a two-piece mold wherein the inner mold piece is sacrificed and forms the inner shell of the enclosure.

12 Claims, 7 Drawing Sheets

LOUDSPEAKER ENCLOSURE

The invention is a loudspeaker enclosure and a method for making a loudspeaker enclosure.

Since the beginning of the era of sound reproduction, loudspeaker enclosures have traditionally been constructed of various types of wood or wood-based panels, such as particle board or pressboard. These panels are cut to the needed sizes and assembled together into a cabinet using glue and metal fasteners. Use of these wooden panels has been cost effective; however, it has dictated that the shape of the enclosure be a box with flat surfaces and 90° angles. It has, therefore, precluded the possibility of a unitary structure and of a structure divorced from the confines of the box-like shape.

The end product of traditional construction has a number of significant acoustic drawbacks:

(a) The sound quality from a loudspeaker is influenced to a great extent by the shape of the enclosure. The box shape dictated by traditional construction materials produces a sound response inferior to that produced by an enclosure specifically designed and made with acoustic response as its primary goal.

(b) A wood-panel enclosure must have several joints of varying length. Gaps in the joints can degrade the acoustic performance of the enclosure, as well as reduce the mechanical integrity of the structure itself.

(c) The perfect loudspeaker enclosure material is perfectly rigid and perfectly acoustically inert (resonance free). Wood or wood-particle material is neither, so that it is not possible to promote practical elimination of vibration (sound) through or along panels made of this material.

(d) Panel vibration degrades the acoustic performance of the enclosure. Even with the very elaborate bracing often employed to reduce this vibration, the flat panels and 90° angles make it difficult to reduce this vibration to an acceptable minimum.

Keeping in mind the foregoing problems, an objective of the present invention is to provide economically an improved speaker enclosure which will be much more rigid and far more acoustically inert than the present type, will be formed in one piece so that there are no unwanted joints, and can be formed easily into a shape suited to the purpose of accurate sound reproduction.

It is felt that this objective is achieved by forming the enclosure of a rigid, acoustically inert material such as polymer concrete which can be molded into a one-piece hollow structure in the shape desired. Polymer concrete will produce an enclosure far more rigid than one constructed of wood or wood-based material. Consequently, the amount of vibration along or through the material will be far less than through traditional panels. Making the enclosure by molding the material eliminates the constraints placed by wood or wood-based material upon the shape of the enclosure: the enclosure may be formed easily into a shape suited to the purpose of sound reproduction. This process also eliminates, or significantly lessens, the number of joints necessary for construction since the enclosure may be molded in one piece, leaving only openings for mounting of speakers and threading of cables.

In producing a hollow enclosure in a threedimensional shape, the part of the mold producing the inner surface of the enclosure may be difficult to remove from the structure when completed. In this invention this inner mold piece itself forms a hollow three-dimensional enclosure. Preferably composed of a semi-rigid, acoustically absorbent material such as fibreglass board having an outer layer of polyurethane foam to increase rigidity and to seal any breaks or holes in the board, this inner mold piece is sacrificed and remains in the loudspeaker enclosure, intimately bonded to the inner surface of the polymer concrete shell. Thus, the inner mold piece forms an inner shell of the enclosure, the fibreglass board providing acoustic damping for the enclosure.

Accordingly, the invention provides a loudspeaker enclosure having at least one opening for attachment of a loudspeaker, comprising a unitary outer shell formed of a rigid acoustically inert material and an inner shell attached to the outer shell. The inner shell is made of a material which provides an acoustic damping environment within the enclosure.

The invention also provides a process for manufacturing a loudspeaker enclosure having a three-dimensional shape defining at least one opening therein for placement of a loudspeaker. An inner mold piece is composed of a semi-rigid, acoustically absorbent material. An outer mold piece is spaced from the inner mold piece so that the two pieces together define the three-dimensional shape of the enclosure. A fluid precursor of the rigid, acoustically inert material is poured into the mold and allowed to set. Then the outer mold piece is removed. The inner mold piece is retained to provide acoustic damping within the enclosure.

DETAILED DESCRIPTION OF THE PREFERRED EMBODIMENT

Figure 2:
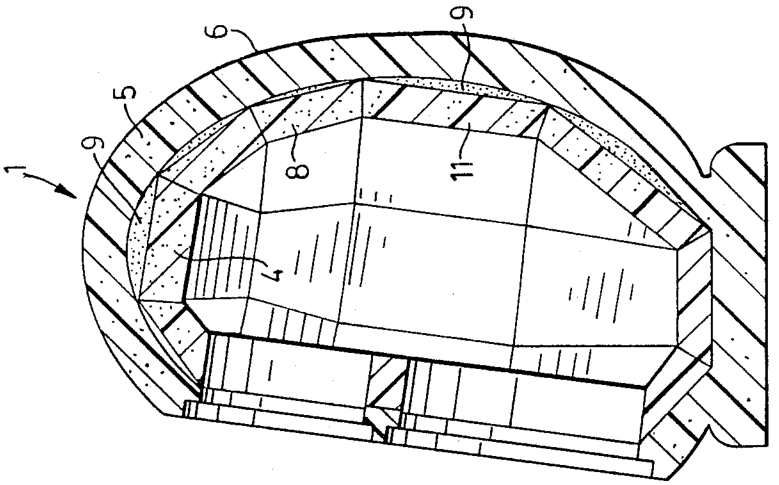
FIG. 2 is a cross-sectional view taken along the line 2—2 of FIG. 1.
Figure 1:
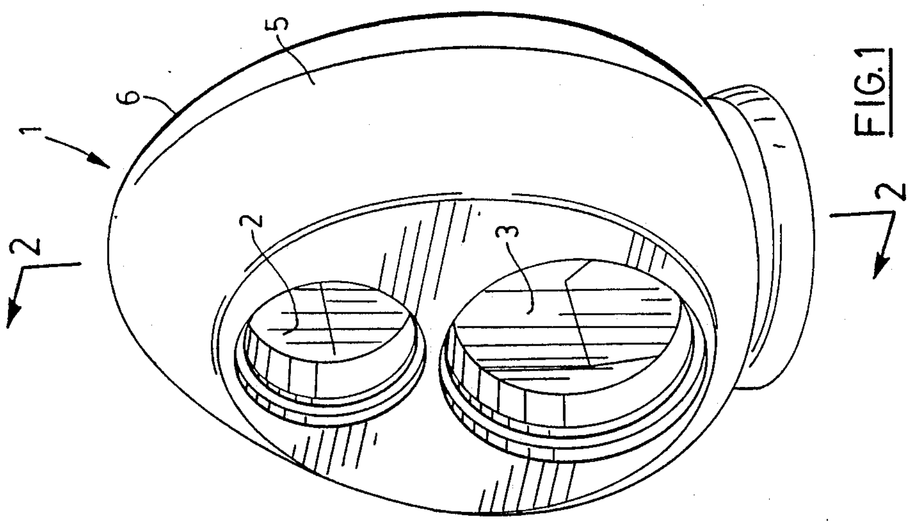
FIG. 1 is a front perspective view of a preferred embodiment of the invention.

FIGS. 1 and 2 show an embodiment of a loudspeaker enclosure 1 made in accordance with this invention. The enclosure 1 is in the form of a unitary hollow structure with two apertures 2 and 3 for mounting speakers therein, and an aperture (not shown) in the rear of the enclosure 1 for threading cables therethrough. The enclosure 1 preferably comprises an inner shell 4 and an outer shell 5. In the drawings, the outer shell 5 has an outside surface 6 which is oviform, a curved shape which minimizes acoustic diffraction. However, the shape of the outside surface 6 formed according to this invention may define any three-dimensional figure. The inner shell 4 has an inner surface which may define any three-dimensional shape. In the drawings, the inner surface 11 generally defines a curved shape (ovoid). Such a curved surface minimizes standing waves inside the enclosure 1.

The inner shell 4 may be composed of a semi-rigid, acoustically absorbent material, such as fibreglass board, which provides the enclosure 1 with high internal damping. If fibreglass board is used, the inner shell 4 may be composed of two portions: an inner portion 8 composed of the fibreglass board and an outer portion 9 composed of a plastic material such as polyurethane foam, which is molded upon and intimately bonded to the fibreglass board 8. The purpose of the plastic outer portion 9 is to make the inner shell 4 rigid enough to hold its desired shape when used as a mold piece and to cover any holes or breaks in the fibreglass board inner portion 8. The use of the polyurethane foam or a similar plastic material for the outer portion 9 also allows the molding of the outer surface of the inner shell 4 in such a way that the surface will contain depressions which will create ribbing in the inner surface of the outer shell 5 when the outer shell 5 is molded upon the inner shell 4. This ribbing will increase the rigidity of the outer shell 5 and produce an extremely acoustically inert enclosure 1.

The outer shell 5 of the enclosure 1 is a unitary structure which is formed by molding it upon, and intimately bonding it to, the outer surface of the inner shell 4. The outer shell 5 may be composed of any material such as polymer concrete which, while becoming in the final instance rigid and acoustically inert, is capable initially of being poured or injected into a mold. A preferred material for the outer shell 5 is polyester concrete. Using such a material allows the outer shell 5 to be cast in one piece and in any three-dimensional shape. Use of polymer concrete also allows connectors and fittings to be molded directly into the enclosure. For example, acoustically inert nylon anchors for screws to mount the speaker frame can be mounted directly into the enclosure 1, thus allowing the speaker frame to be better decoupled from contact with the enclosure 1.

The preferred loudspeaker enclosure 1 of the invention may be manufactured by forming an inner mold piece which is the inner shell 4 shown in FIGS. 1 and 2, the inner mold piece 4 being made of a semi-rigid acoustically absorbent material. An outer mold piece is formed and spaced from the inner mold piece 4, the space between the two mold pieces defining the three-dimensional shape of the enclosure 1. A fluid precursor of a rigid acoustically inert material is poured into the mold and allowed to set. The outer mold piece is then removed with the inner mold piece 4 forming the inner shell 4 of the enclosure 1.

Figure 3:
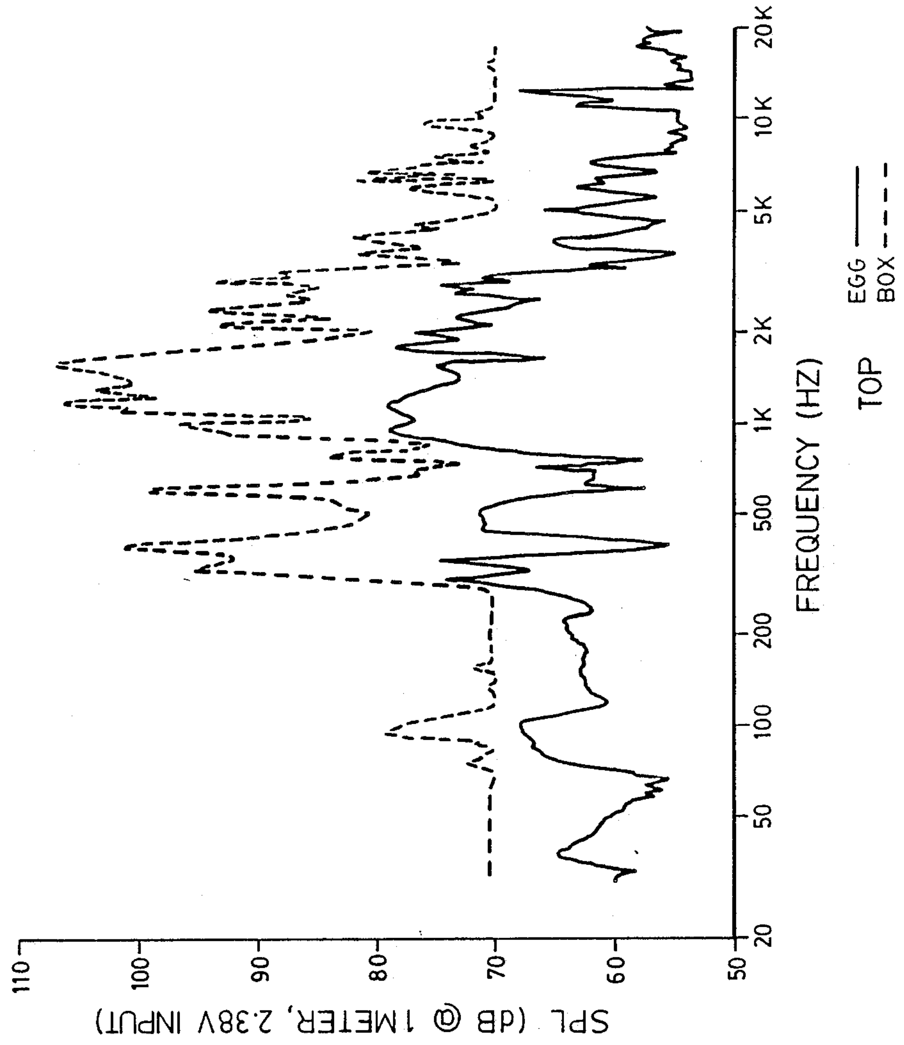
FIGS. 3 through 6 are graphs comparing the amounts of wall vibration in the enclosure shown in FIGS. 1 and 2 and in a conventional wooden box enclosure when measured respectively from the top, the right side, the rear and the front of the enclosures.
Figure 4:
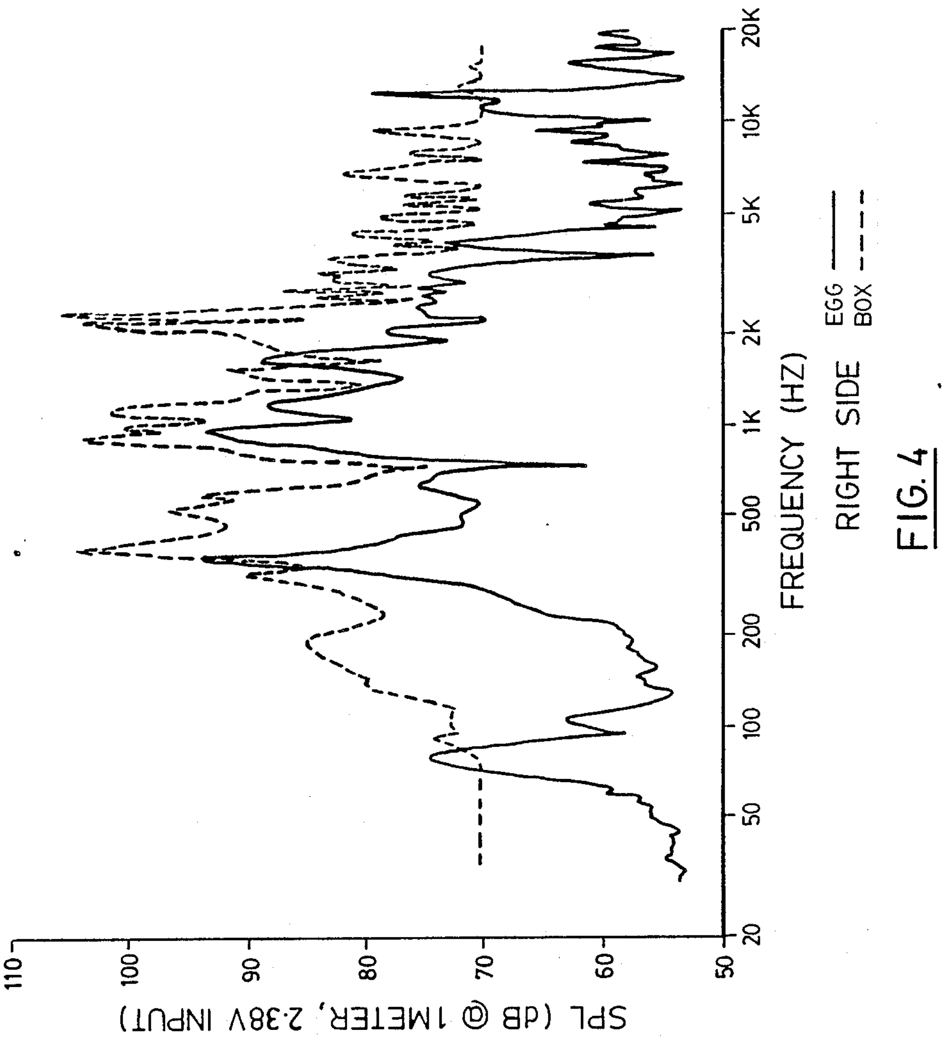
Figure 5:
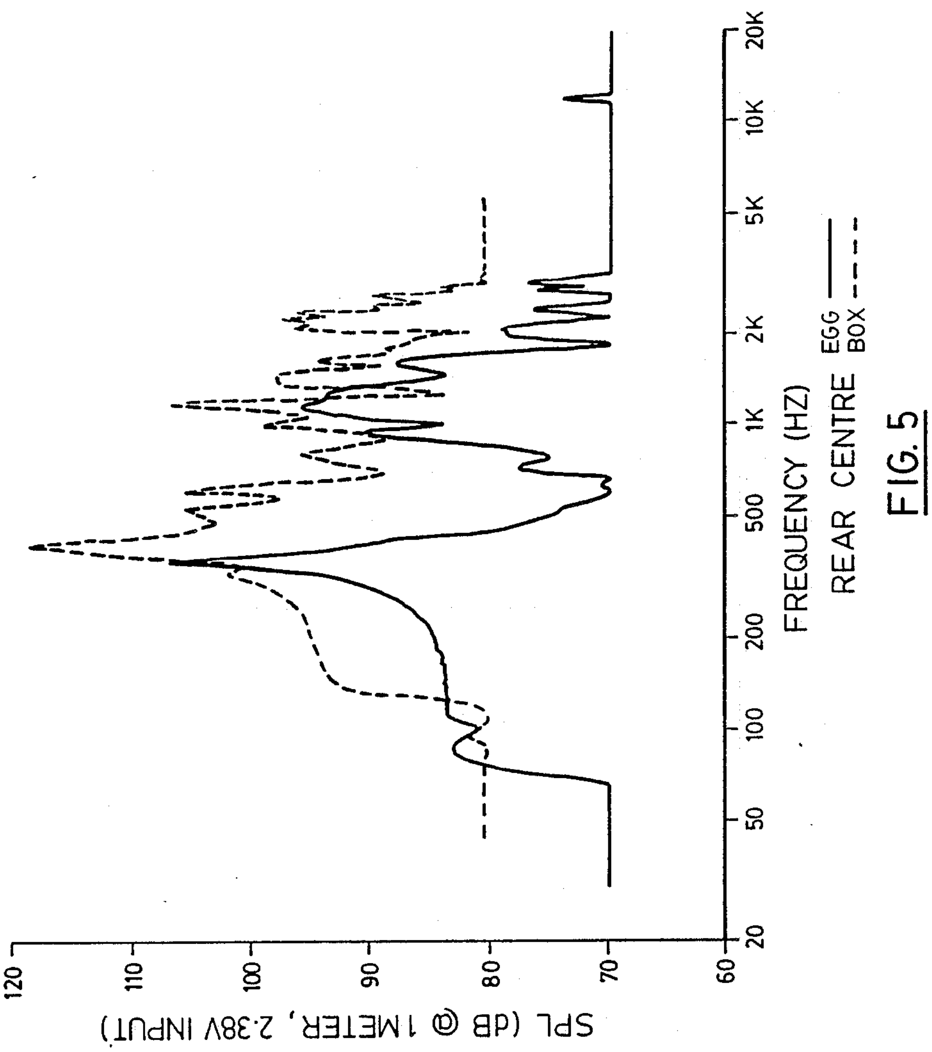
Figure 6:
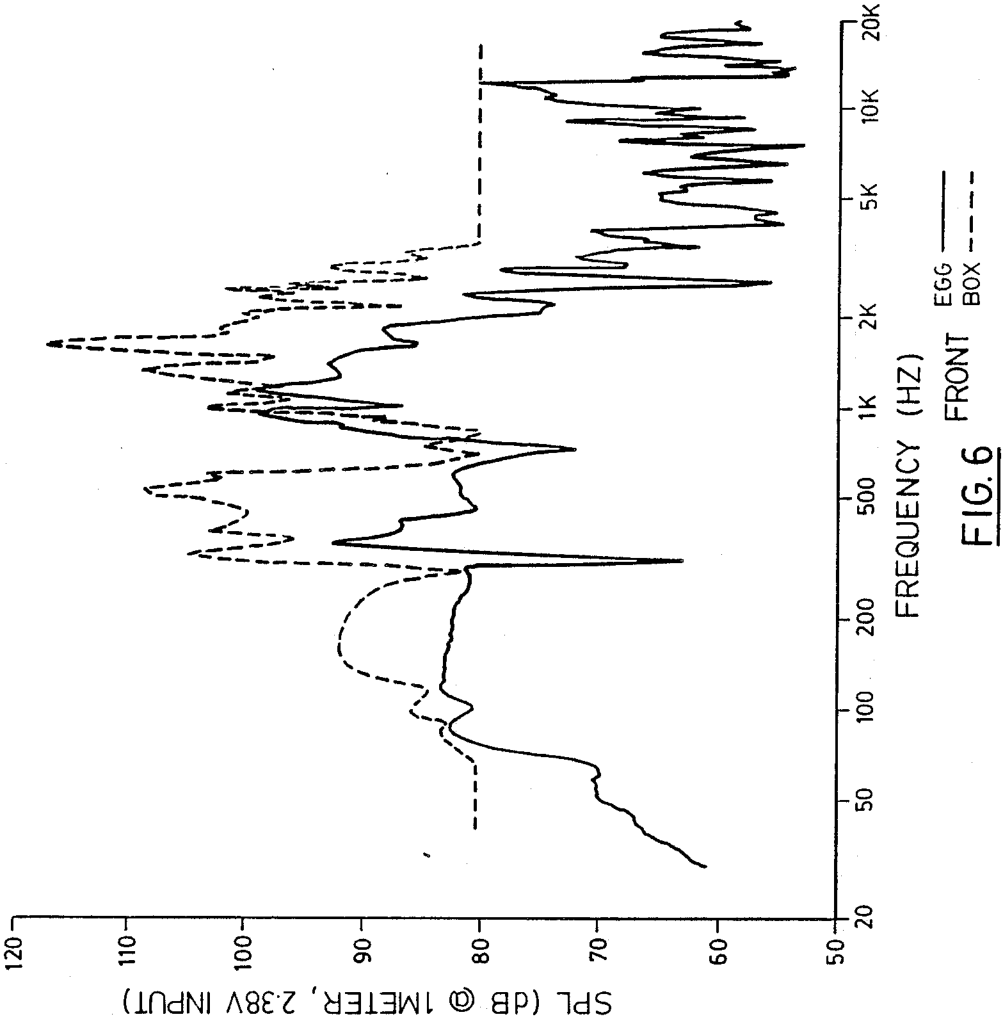

FIGS. 3 through 6 display data obtained from the measurement of wall vibration in the loudspeaker enclosure 1 shown in FIGS. 1 and 2 as compared to a conventional wooden box type loudspeaker enclosure. The conventional enclosure was built using high-quality particle board and had an internal volume equivalent to that of the polymer concrete enclosure 1. Identical speakers (drivers) were used in both enclosures, and the speakers were all driven with the same input voltage (2.83 V). The sound pressure level was measured at a distance of one meter. An anechoic chamber was used for the testing. Accelerometers were placed at various points on the enclosures: FIG. 3 shows the data obtained when the accelerometers were placed at the tops of the enclosures; FIG. 4, at the right sides of the enclosures; FIG. 5, at the rear centers of the enclosures; and FIG. 6, at the fronts of the enclosures. A standard sweep signal (20-20,000 Hz) was applied, and the accelerometers measured movement in the walls of the enclosures at the points of mounting. In FIGS. 3 through 6, the solid line shows the data for the polymer concrete enclosure of the invention (egg); the broken line, for the conventional enclosure (box). These comparative graphs show consistently less vibration in the polymer concrete enclosure than in the conventional enclosure with an attenuation of vibration by as much as 30 dB at some frequencies. The graphs show far lower resonances and far fewer resonances in the polymer concrete enclosure than in the conventional one.

Figure 7:
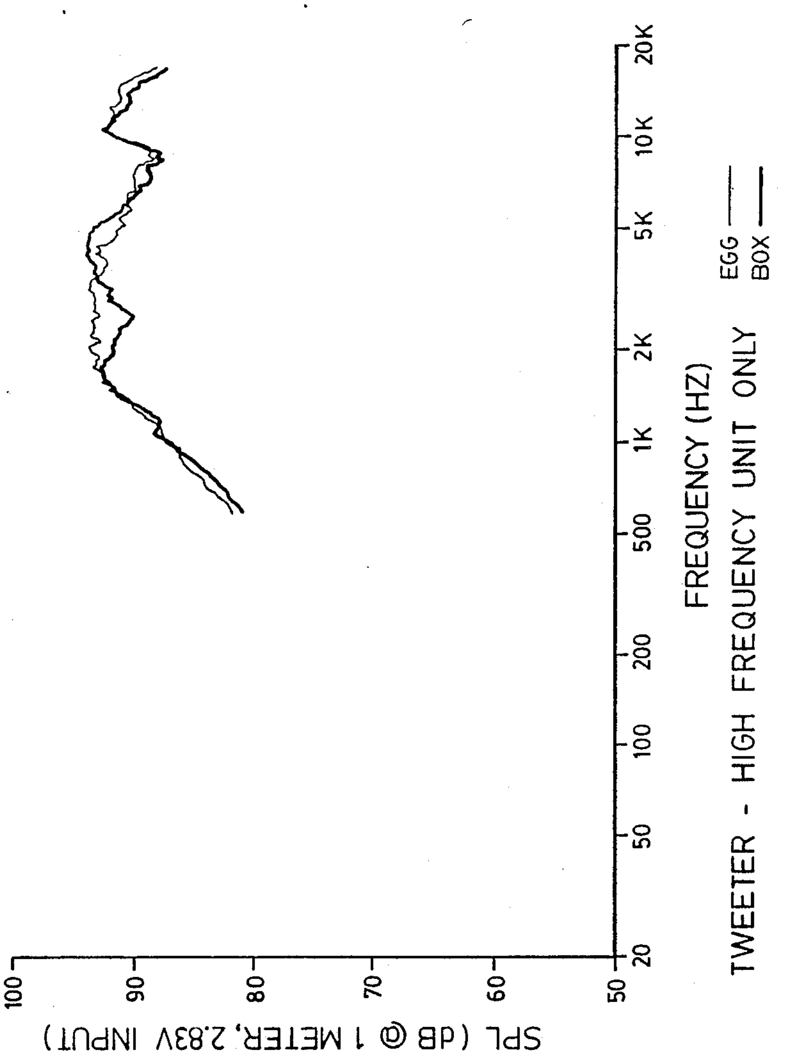
FIGS. 7 and 8 are graphs comparing responses of the tweeters and the woofers respectively when these are mounted in the enclosures shown in FIGS. 1 and 2 and in a conventional wooden box enclosure.
Figure 8:
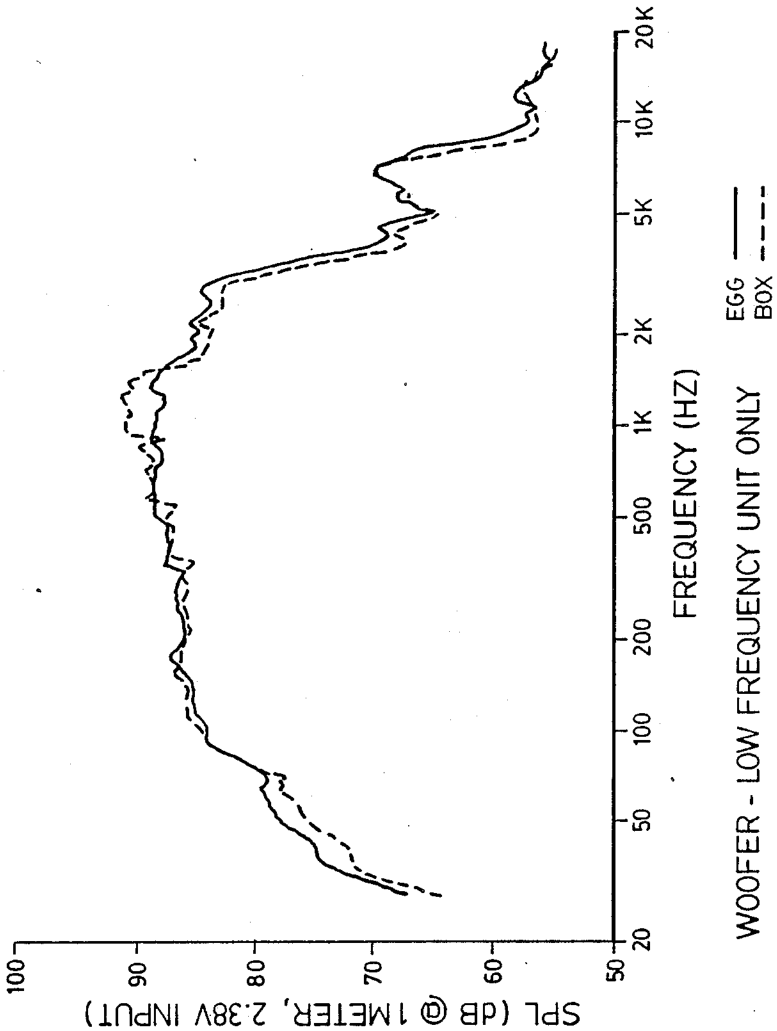

The data in FIGS. 7 and 8 were obtained using the same enclosures and the same methods as were used for obtaining the data in FIGS. 3 through 6. These figures show the comparative responses of the speakers mounted in the conventional enclosure and the polymer concrete enclosure 1. The darker curve shows the response in the conventional enclosure (box); the lighter curve, in the polymer concrete enclosure 1 (egg). The response of the tweeters is shown in FIG. 7; of the woofers, in FIG. 8. As displayed in the graphs, curves for the speakers are notably smoother in the polymer concrete enclosure 1 than in the conventional enclosure. The smoother the curve, the fewer the resonances. These graphs illustrate the beneficial effect of the oviform shape of the polymer concrete enclosure 1 over the box-shape of the conventional one.

The foregoing description is intended to illustrate the general principles of the invention as applied to a preferred embodiment. This description should not be taken to limit the scope of the invention which is particularly defined in the following claims.

I claim:

1. A loudspeaker enclosure, comprising:

a one-piece molded hollow structure having an inner surface and defining at least one opening with mounting means for attachment of a loudspeaker which when mounted in said opening coacts with the enclosure to project sound, the structure being formed of a rigid and substantially acoustically inert material; and an inner shell being attached to the inner surface of the one-piece hollow structure, the inner shell being formed of a semi-rigid, acoustically absorbent material having a coating of a plastic material which forms an interface between the inner shell and the inner surface of the one-piece hollow structure.

2. A loudspeaker enclosure as claimed in claim 1, wherein the one-piece hollow structure is made of a polymer concrete.

3. A loudspeaker enclosure as claimed in claim 2, wherein the polymer concrete is a polyester concrete.

4. A loudspeaker enclosure as claimed in claim 1, wherein the inner shell is made of fibreglass.

5. A loudspeaker enclosure as claimed in claim 4, wherein the inner shell is made of fibreglass board.

6. A loudspeaker enclosure as claimed in claim 1, wherein the plastic material is polyurethane foam.

7. A loudspeaker enclosure having at least one opening with mounting means for attachment of a loudspeaker which when mounted in said opening coacts with the enclosure to project sound, comprising:

a one-piece molded outer shell formed of a rigid and substantially acoustically inert material; and an inner shell attached to the outer shell, the inner shell being made of a material which provides an acoustic damping environment within the enclosure and having a coating of a plastic material which forms an interface between the inner shell and the outer shell.

8. A loudspeaker enclosure as claimed in claim 7, wherein the outer shell is made of a polymer concrete.

9. A loudspeaker enclosure as claimed in claim 8, wherein the polymer concrete is a polyester concrete.

10. A loudspeaker enclosure as claimed in claim 7, wherein the inner shell is made of fibreglass.

11. A loudspeaker enclosure as claimed in claim 10, wherein the fiberglass is fibreglass board.

12. A loudspeaker enclosure as claimed in claim 7, wherein the plastic material is polyurethane foam.

* * * * *